US005496667A

United States Patent [19]

Yabe et al.

[11] Patent Number: 5,496,667

[45] Date of Patent: Mar. 5, 1996

[54] X-RAY MASK AND ITS FABRICATION METHOD

[75] Inventors: Hideki Yabe; Kenji Marumoto; Nobuyuki Yoshioka, all of Hyogo, Japan

[73] Assignee: Mitsubishi Denki Kabushiki Kaisha, Tokyo, Japan

[21] Appl. No.: 427,986

[22] Filed: Apr. 24, 1995

Related U.S. Application Data

[63] Continuation of Ser. No. 46,083, Apr. 12, 1993, abandoned.

[30] Foreign Application Priority Data

Jun. 8, 1992 [JP] Japan .................................. 4-147087

[51] Int. Cl.$^6$ ...................................................... G03F 9/00

[52] U.S. Cl. .................................. 430/5; 378/34; 378/35

[58] Field of Search ................................. 430/5; 378/34, 378/35

[56] References Cited

U.S. PATENT DOCUMENTS

| | | | |
|---|---|---|---|
| 4,865,952 | 9/1989 | Yoshioka et al. | 430/315 |
| 4,873,162 | 10/1989 | Yoshioka et al. | 430/5 |
| 5,132,186 | 7/1992 | Takeuchi et al. | 430/5 |
| 5,188,706 | 2/1993 | Hori et al. | 430/5 |
| 5,196,283 | 3/1993 | Ikeda et al. | 430/5 |

FOREIGN PATENT DOCUMENTS

| | | |
|---|---|---|
| 63-76325 | 4/1988 | Japan . |
| 63-232425 | 9/1988 | Japan . |

*Primary Examiner*—S. Rosasco
*Attorney, Agent, or Firm*—Wolf, Greenfield & Sacks

[57] ABSTRACT

In order to provide an X-ray absorber low in the internal stress and suitable for forming a high accurate pattern and its fabrication method, an X-ray absorber for an X-ray mask is intended to contain tungsten and nitrogen, or tungsten, titanium and nitrogen, and to have an amorphous structure.

8 Claims, 3 Drawing Sheets

■ NITROGEN 7% BEFORE ANNEALING
□ NITROGEN 7% AFTER ANNEALING AT 390°C
◆ NITROGEN 7% BEFORE ANNEALING
◇ NITROGEN 7% AFTER ANNEALING AT 300°C
▲ NITROGEN 7% BEFORE ANNEALING
△ NITROGEN 7% AFTER ANNEALING AT 250°C
X NITROGEN 5%
* NITROGEN 10%

N: BROAD CREST SHOWING AMORPHOUS MATERIAL

X-RAY MASK AND ITS FABRICATION METHOD

This application is a continuation, of application Ser. No. 08/046,083, filed Apr. 12, 1993 now abandoned.

BACKGROUND OF THE INVENTION

1. Field of the Invention

The present invention relates to an X-ray mask used for X-ray lithography and its fabrication method.

2. Description of the Prior Art

Conventionally, there have been used heavy metals such as Au, W, Ta as X-ray absorbers for X-ray masks. However, in using these heavy metals as X-ray absorbers, it was difficult to reduce the internal stress of each absorber. To solve the disadvantage, the present inventors have developed such an X-ray mask as shown in Japanese Patent Laid-open No. sho 63-232425, wherein a Ti—W alloy film is formed by sputtering at an atmosphere of an argon gas added with nitrogen. The above technique made it possible to form the film of the absorber low in the internal stress with high repeatability.

Incidentally, the X-ray absorber of the Ti—W alloy film previously proposed was low in internal stress; but had such a tendency that the crystal structure became columnar. For X-ray absorber having the columnar structure, the etching tends to proceed by each columnar unit. This causes a disadvantage in degrading the dimensional accuracy of the pattern.

SUMMARY OF THE INVENTION

In view of the foregoing, it is an object of the present invention to provide an X-ray absorber low in internal stress and suitable for the formation of a highly accurate pattern, and a method for forming a film thereof.

It is another object of the present invention to provide an X-ray absorber capable of improving the positional accuracy of a mask and of improving the dimensional accuracy of the pattern and a fabrication method thereof.

It is a further object of the present invention to provide a X-ray absorber capable of improving the contrast in transfer, and a fabrication method thereof.

It is a still further object of the present invention to provide an X-ray absorber capable of reducing an aspect ratio in etching thereby making easy the etching and a fabrication method thereof.

According to the first aspect of the present invention, for achieving the above-mentioned object, there is provided an X-ray mask comprising an X-ray absorber containing tungsten and nitrogen or tungsten, titanium and nitrogen, and having an amorphous structure.

According to the second aspect of the present invention, there is provided a method for fabricating an X-ray mask comprising the step of forming a film of an X-ray absorber by sputtering at an atmosphere of an inert gas added with nitrogen in an amount of 1% or more and less than 30% using a target of single tungsten or tungsten added with titanium.

According to the third aspect of the present invention, there is provided a method for fabricating an X-ray mask, wherein the film thus obtained by sputtering is annealed at a temperature ranging from 50° C. to 500° C.

According to the fourth aspect of the present invention, there is provided a method for fabricating an X-ray mask, wherein the surface roughness of a substrate prior to film formation of the absorber is within the range of 0.05 μm or less.

As stated above, in the X-ray mask according to the first aspect of the present invention, since the X-ray absorber contains tungsten and nitrogen, or contains tungsten, titanium and nitrogen, the internal stress thereof can be reduced, to thereby improve the positional accuracy of the mask pattern. Also, since the structure of the X-ray absorber is not columnar, the dimensional accuracy of the pattern is improved.

Further, in the method for fabricating an X-ray mask according to the second aspect of the present invention, since the film of the X-ray absorber is formed by sputtering at an atmosphere of an inert gas added with nitrogen in an amount of 1% or more and less than 30% using a target of single tungsten or tungsten added with titanium, the internal stress thereof can be reduced to thereby improve the positional accuracy of the mask pattern, and further, the amorphous structure can be obtained to thereby improve the dimensional accuracy of the pattern. Also, the density is high, which contributes to an improvement of the X-ray absorbing power. Accordingly, it is possible to improve the contrast in transfer, and to reduce the film thickness of the absorber for the same contrast thereby making easy the etching of the absorber.

Further, in the method for fabricating the X-ray mask according to the third aspect of the present invention, the film thus sputtered is annealed at a temperature ranging from 50° C. to 500° C., which makes it possible to control the internal stress to be a further smaller value.

Still further, in the method for fabricating an X-ray mask according to the fourth aspect of the present invention, the surface roughness of the substrate prior to film formation of the absorber is made to be 0.05 μm or less, which makes it possible to easily obtain the amorphous structure.

The above and further objects and novel features of the invention will more fully appear from the following detailed description when the same is read in connection with the accompanying drawing. It is to be expressly understood, however, that the drawings are for purpose of illustration only and are not intended as a definition of the limits of the invention.

DETAILED DESCRIPTION OF THE PREFERRED EMBODIMENTS

Preferred embodiments of the invention will now be described in detail referring to the accompanying drawings.

EMBODIMENT 1

Figure 1:
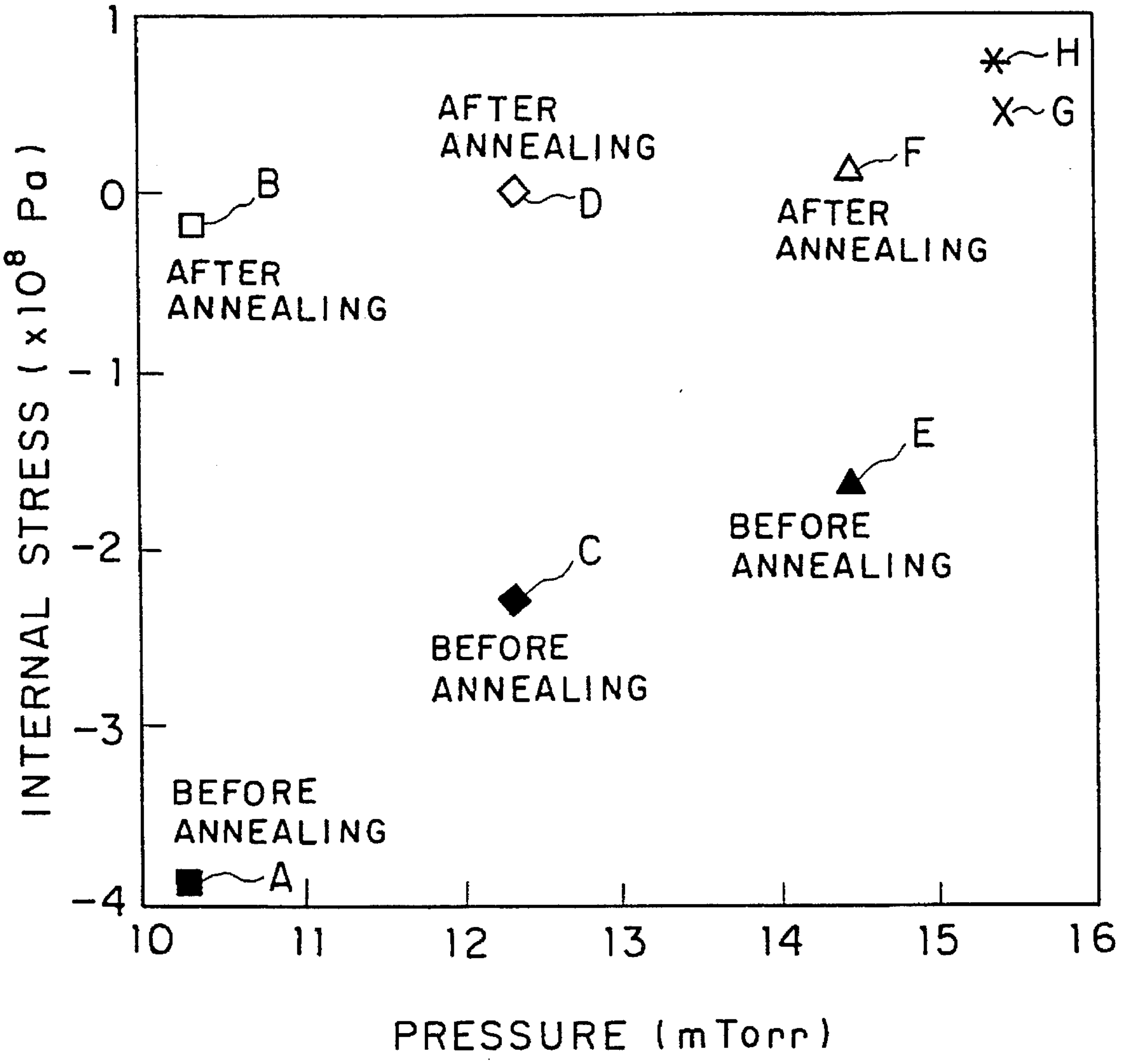
FIG. 1 is a characteristic view showing internal stresses of X-ray absorbers according to Embodiments 1 to 5 of the present invention.
Figure 2:
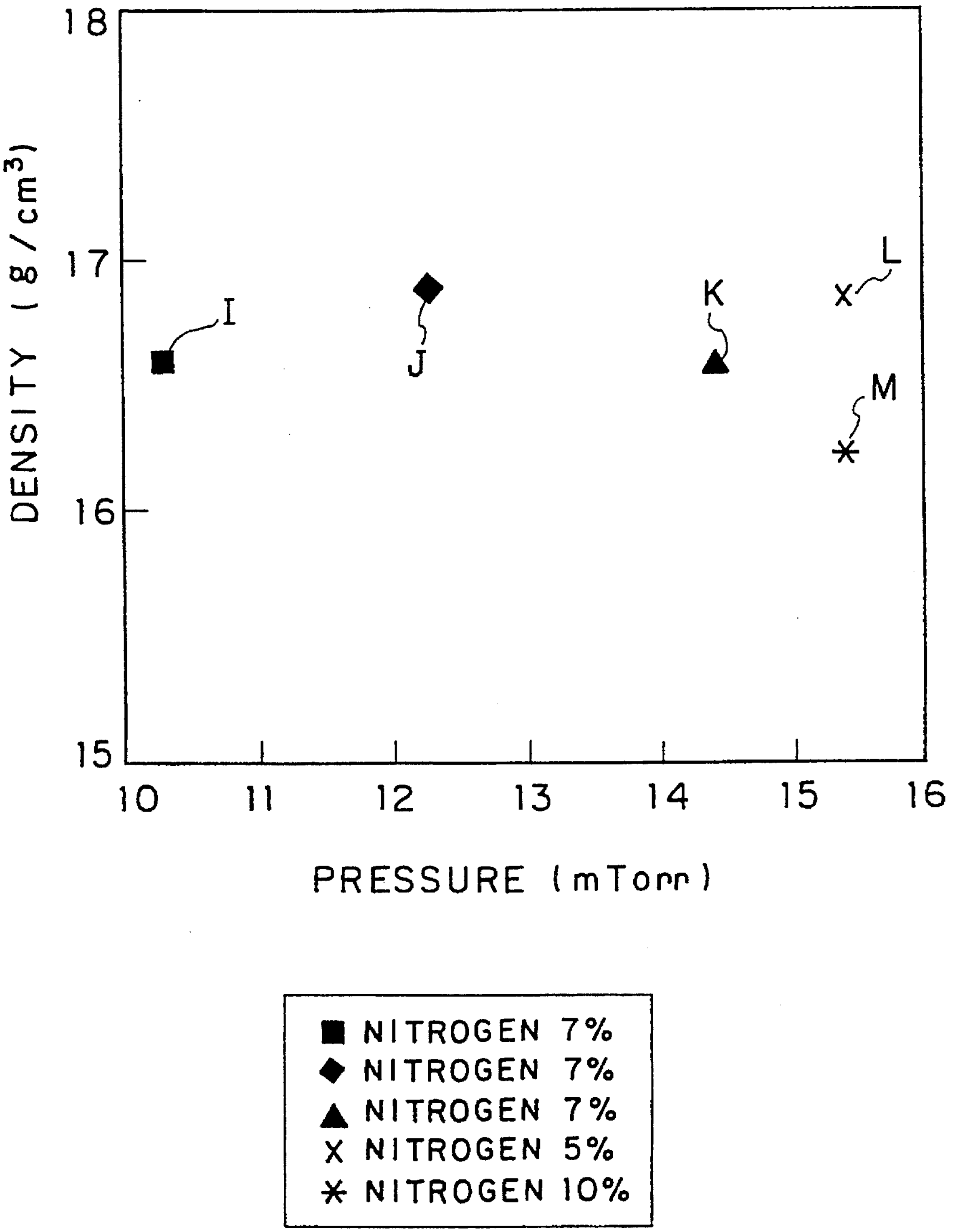
FIG. 2 is a characteristic view showing densities of the X-ray absorbers according to Embodiments 1 to 5 of the present invention.

In FIG. 1, points A and B show the internal stresses before and after annealing for 1 hour at 390° C. a film of an X-ray absorber, which is formed on a silicon substrate using a target of tungsten added with 1 wt % of titanium under the condition of an atmosphere of an Ar gas added with 7% of a $N_2$ gas, a pressure of 10.3 mTorr and a power of 0.5 kW in DC discharge. In addition, Table 1 shows the film formation condition, internal stress, density and structure.

discharge. The internal stress of the absorber after annealing is made smaller as compared with that before annealing. In addition, a J point in FIG. 2 shows the density under the above condition, which highly increases up to 16–17 g/cm$^3$. The structure of this sample is also amorphous just as in Embodiment 1.

TABLE 1

| | EMBODIMENT 1 | EMBODIMENT 2 | EMBODIMENT 3 | EMBODIMENT 4 | EMBODIMENT 5 | CONVENTIONAL EXAMPLE |
|---|---|---|---|---|---|---|
| CONDITION OF FILM FORMATION | | | | | | |
| TARGET | W-1 Wt % Ti | W-1 Wt % Ti | W-1 Wt % Ti | W-1 Wt % Ti | W-1 Wt % Ti | W-1 Wt % Ti |
| GAS | Ar - 7% N2 | Ar - 7% N2 | Ar - 7% N2 | Ar - 5% N2 | Ar - 10% N2 | Ar - 30% N |
| PRESSURE (mTorr) | 10.3 | 12.3 | 14.4 | 15.4 | 15.4 | 15.4 |
| DC POWER (KW) | 0.5 | 0.6 | 0.8 | 0.8 | 0.8 | 0.8 |
| ANNEALING TEMPERATURE | 390° C. | 300° C. | 250° C. | NO ANNEALING | NO ANNEALING | 250° C. |
| ANNEALING TIME | 1 hr | 1 hr | 1 hr | | | 1 hr |
| INTERNAL STRESS | | | | | | |
| BEFORE ANNEALING (× 10$^8$ Pa) | −3.88 | −0.23 | −1.60 | 0.48 | 0.71 | −1 ~ −2 |
| AFTER ANNEALING (× 10$^8$ Pa) | −0.15 | 0.03 | 0.16 | | | −1 ~ 1 |
| DENSITY (g/cm$^3$) | 16.6 | 16.9 | 16.6 | 16.9 | 16.2 | 13 ~ 14 |
| STRUCTURE | AMORPHOUS | AMORPHOUS | AMORPHOUS | AMORPHOUS | AMORPHOUS | COLUMNAR |

NOTE)
IN THE ITEM OF <INTERNAL STRESS>, THE SYMBOLS (−) AND (+) SHOW THE COMPRESSIVE STRESS AND TENSILE STRESS, RESPECTIVELY.

As is apparent from the result, the internal stress of the absorber after annealing is made smaller as compared with that before annealing, and it becomes 1×10$^8$ Pa or less. In addition, an I point in FIG. 2 shows the density under the above condition, which highly increases up to 16–17 g/cm$^3$.

Figure 3:
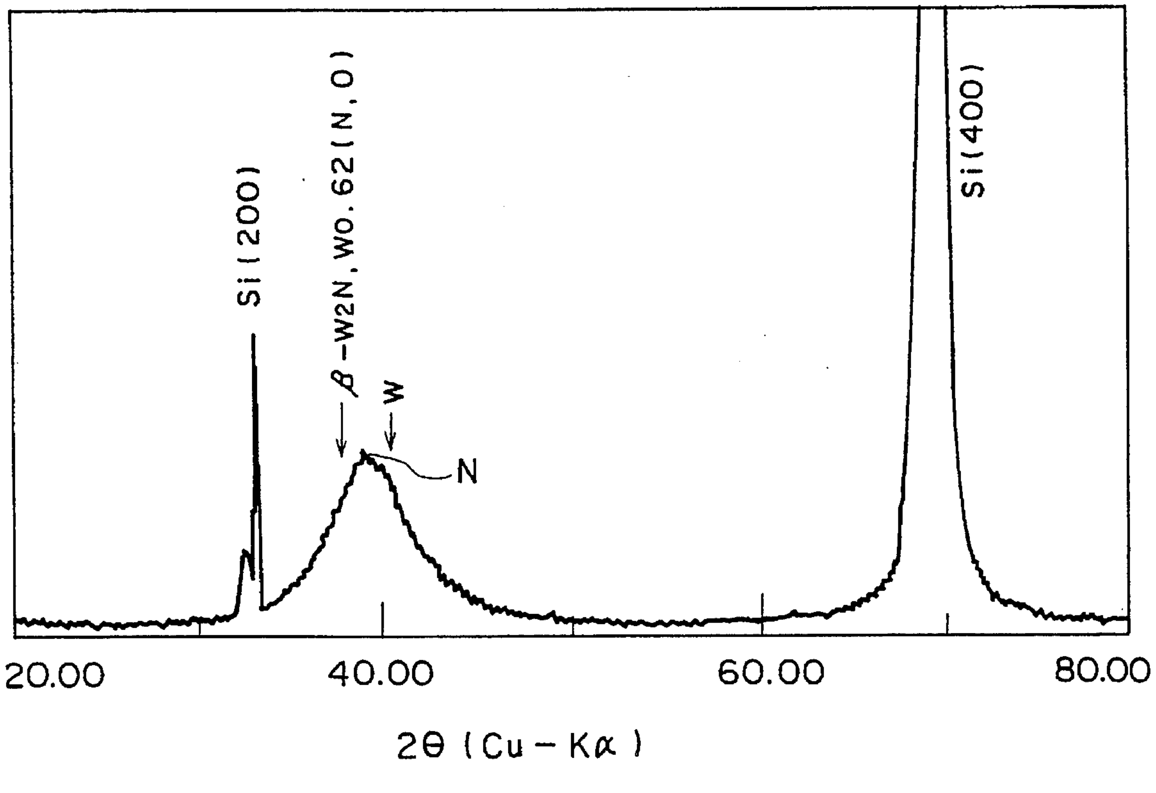
FIG. 3 is an explanatory view showing the result of X-ray diffraction for the X-ray absorber according to Embodiment 1 of the present invention.

FIG. 3 shows the result of X-ray diffraction of the sample obtained under the above condition. The ordinate indicates the relative peal intensity, and the abscissa indicates the diffraction angle in X-ray diffraction using CuK-α ray. The broad crest (in this figure, indicated at N) is observed, differently from the peak of the silicon substrate. There is no material corresponding to the position of the broad crest; however, before and after the position, there are the peaks of β-$W_2N$, $W_{0.62}$ (N, 0) and the peak of the tungsten, and consequently, it seems to be the amorphous material formed by mixing of the tungsten, nitride of the tungsten, nitride/oxide of the tungsten and the like. As a result of observation for the sectional structure by scanning electron microscope (SEW), the structure is not columnar but amorphous.

In addition, in the sample where the substrate of SiC and the like has an irregularity of about 0.1 μm, the reduction in the internal stress is possible; however, by the observation of the SEM, the structure becomes partially amorphous. In the sample where the substrate of the silicon, Sin, $SiO_2$, quartz, SOG, polyimide and the like has the irregularity of 0.05 μm or less, it is observed that the whole surface becomes amorphous.

EMBODIMENT 2

In FIG. 1, points C and D show the internal stresses before and after annealing for 1 hour at 300° C. a film of an X-ray absorber, which is formed on a silicon substrate using the same target as in Embodiment 1 under the condition of an atmosphere of an Ar gas added with 7% of a $N_2$ gas, a pressure of 12.3 mTorr and a power of 0.6 kW in DC

EMBODIMENT 3

In FIG. 1, points E and F show the internal stresses before and after annealing for 1 hour at 250° C. a film of an X-ray absorber, which is formed on a silicon substrate using the same target as in Embodiment 1 under the condition of an atmosphere of an Ar gas added with 7% of a $N_2$ gas, a pressure of 14.4 mTorr and a power of 0.8 kW in DC discharge. The internal stress of the absorber after annealing is made smaller as compared with that before annealing. Consequently, it is revealed that a low internal stress film can be obtained in this condition. In addition, a K point in FIG. 2 shows the density under the above condition, which highly increases up to about 16–17 g/cm$^3$. The structure of this sample is also amorphous just as in embodiment 1.

EMBODIMENT 4

In FIG. 1, a point G shows the internal stress for a film of an X-ray absorber, which is formed on a silicon substrate using the same target as in Embodiment 1 under the condition of an atmosphere of an Ar gas added with 5% of a $N_2$ gas, a pressure of 15.4 mTorr and a power of 0.8 kW in DC discharge. It is revealed that the low stress film can be obtained without annealing. Also, an L point in FIG. 2 shows the density under the above condition. It becomes apparent that the absorber with high density is formed. In addition, the structure of this sample is also amorphous just as in Embodiment 1.

EMBODIMENT 5

In FIG. 1, a point H shows the internal stress for a film of a X-ray absorber, which is formed on a silicon substrate using the same target as in Embodiment 1 under the condition of an atmosphere of an Ar gas added with 10% of a $N_2$ gas, a pressure of 15.4 mTorr and a power of 0.8 kW in DC discharge. It is revealed that a low stress film can be obtained. In addition, an M point in FIG. 2 shows the density under the above condition. It is revealed that a absorber with high density is formed. In addition, the structure of this sample is amorphous just as in Embodiment 1.

In the above embodiments, the target of tungsten added with 1 wt % of titanium is used, the argon gas is added with nitrogen in an amount of 5–10%, and the annealing temperature is set to be 250–350° C.; however, the same effect can be obtained under the following condition: namely, the added amount of titanium is within the range of 0–10 wt %, the added amount of nitrogen to an inert gas is 1% or more and less than 30%, and the annealing temperature is within the range of 50°–500° C.

Further, in the above embodiments, the DC discharge is used; however, the RF discharge may be used. Also, in the above embodiments, the target is constituted of W or W—Ti; however, it may previously contain nitrogen.

In the above description, the present invention is applied to the film formation of the X-ray absorber for the X-ray mask. This fabrication method, however, may be applied not only to the fabrication of the X-ray mask, but also to the case where the internal stress is desired to be smaller in other film formation, or to the case where the structure is desired to be amorphous.

As described above, according to the present invention, since the X-ray absorber for the X-ray mask contains tungsten and nitrogen or tungsten, titanium and nitrogen, and has the amorphous structure, there can be obtained an X-ray absorber low in internal stress and suitable for the formation of a highly accurate pattern.

Also, in the method for fabricating the X-ray mask according to the present invention, since the film of the X-ray absorber is formed by sputtering at an atmosphere of an inert gas added with nitrogen in an amount of 1% or more and less than 30% using a target of single tungsten or tungsten added with titanium, it is possible to reduce the internal stress, and hence to improve the positional accuracy of the mask pattern. Also, since the absorber becomes amorphous, the dimensional accuracy of the pattern is improved in etching. Further, since the density in the film formation is large, the X-ray absorbing power is improved. Accordingly, it is possible to improve the contrast in transfer, and to reduce the film thickness of the absorber for the same contrast. This makes it possible to reduce the aspect ratio in etching, and hence to make easy the etching of the absorber.

Further, by annealing of the film thus sputtered at a temperature ranging from 50° C. to 500° C., it is possible to control the internal stress to be a further smaller value, and hence to further improve the positional accuracy of the mask pattern.

Still further, in the above-mentioned fabrication method, the surface roughness of the substrate prior to film formation of the absorber is made to be 0.05 μm or less, which makes it possible to easily obtain the amorphous structure, and hence to further improve the dimensional accuracy of the pattern.

What is claimed is:

1. A method for fabricating an X-ray mask comprising:

forming a film of an X-ray absorber by sputtering at an atmosphere of an inert gas added with nitrogen in an amount of 1% or more and less than 30% using a target of single tungsten or tungsten added with titanium.

2. A method for fabricating an X-ray mask according to claim 1, wherein said film is annealed at a temperature ranging from 50 to 500° C. after sputtering.

3. A method for fabricating an X-ray mask according to claim 2, wherein the surface roughness of a substrate prior to the film formation of said X-ray absorber is within the range of 0.05 μm or less.

4. A method for fabricating an X-ray mask according to claim 1, wherein the surface roughness of a substrate prior to the film formation of said X-ray absorber is within the range of 0.05 μm or less.

5. An X-ray mask comprising an X-ray absorber containing tungsten and nitrogen, and wherein said mask has an entirely amorphous structure even after annealing, said mask being compressive before annealing and being stress free after annealing.

6. An X-ray mask comprising an X-ray absorber containing tungsten and nitrogen, having an amorphous structure even after annealing, and wherein said mask has an amorphous structure immediately after being formed and before annealing, said mask being compressive before annealing and being stress free after annealing.

7. An X-ray mask comprising an X-ray absorber containing tungsten, titanium and nitrogen, and wherein said mask has an entirely amorphous structure even after annealing, said mask being compressive before annealing and being stress free after annealing.

8. An X-ray mask comprising an X-ray absorber containing tungsten, titanium and nitrogen, having an amorphous structure after annealing and wherein said mask has an amorphous structure immediately after being formed and before annealing, said mask being compressive before annealing and being stress free after annealing.

* * * * *